(12) United States Patent
Ohashi

(10) Patent No.: US 8,748,842 B2
(45) Date of Patent: Jun. 10, 2014

(54) ELECTROSTATIC LENS ARRAY

(71) Applicant: Canon Kabushiki Kaisha, Tokyo (JP)

(72) Inventor: Yasuo Ohashi, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/915,834

(22) Filed: Jun. 12, 2013

(65) Prior Publication Data

US 2013/0341526 A1    Dec. 26, 2013

(30) Foreign Application Priority Data

Jun. 22, 2012 (JP) ................... 2012-140610

(51) Int. Cl.
*G21K 1/08* (2006.01)

(52) U.S. Cl.
USPC ............ 250/396 R; 250/492.3; 250/398

(58) Field of Classification Search
None
See application file for complete search history.

(56) References Cited

U.S. PATENT DOCUMENTS

| | | | | |
|---|---|---|---|---|
| 6,118,129 | A * | 9/2000 | Oae et al. | 250/492.22 |
| 6,593,584 | B2 * | 7/2003 | Krans et al. | 250/492.2 |
| 8,362,441 | B2 * | 1/2013 | Koning et al. | 250/396 R |
| 2001/0054690 | A1 * | 12/2001 | Shimada et al. | 250/306 |
| 2002/0005491 | A1 * | 1/2002 | Yagi et al. | 250/396 ML |
| 2003/0122085 | A1 * | 7/2003 | Stengl et al. | 250/423 F |
| 2003/0124716 | A1 * | 7/2003 | Hess et al. | 435/287.1 |
| 2003/0180807 | A1 * | 9/2003 | Hess et al. | 435/7.1 |
| 2005/0072941 | A1 * | 4/2005 | Tanimoto et al. | 250/492.22 |
| 2005/0264148 | A1 * | 12/2005 | Maldonado et al. | 313/103 R |
| 2005/0270514 | A1 * | 12/2005 | Hahn | 355/67 |
| 2006/0198404 | A1 * | 9/2006 | Henrichs | 372/29.02 |
| 2007/0188091 | A1 * | 8/2007 | Kimiya et al. | 313/506 |
| 2010/0261159 | A1 * | 10/2010 | Hess et al. | 435/6 |
| 2010/0288938 | A1 * | 11/2010 | Platzgummer | 250/396 R |
| 2011/0266418 | A1 * | 11/2011 | Wieland et al. | 250/208.2 |
| 2012/0015303 | A1 * | 1/2012 | Hirata et al. | 430/296 |
| 2012/0021951 | A1 * | 1/2012 | Hess et al. | 506/13 |
| 2012/0145931 | A1 * | 6/2012 | Van Melle et al. | 250/559.01 |
| 2012/0273658 | A1 * | 11/2012 | Wieland et al. | 250/208.2 |
| 2013/0021593 | A1 * | 1/2013 | Onvlee et al. | 355/72 |
| 2013/0043413 | A1 * | 2/2013 | De Boer et al. | 250/492.3 |

FOREIGN PATENT DOCUMENTS

| | | |
|---|---|---|
| JP | 2005-032480 A | 2/2005 |
| WO | 2011/043668 A1 | 4/2011 |

* cited by examiner

*Primary Examiner* — Andrew Smyth
(74) *Attorney, Agent, or Firm* — Fitzpatrick, Cella, Harper & Scinto

(57) ABSTRACT

Provided is an electrostatic lens array, including multiple substrates arranged with intervals, each of the multiple substrates having an aperture for passing a charged particle beam, in which: in a travelling direction of the charged particle beam, a peripheral contour line formed by any one of surfaces of the multiple substrates other than an upper surface of a most upstream substrate and a lower surface of a most downstream substrate has a protruding portion protruding from a peripheral contour line of one of the upper surface of the most upstream substrate and the lower surface of the most downstream substrate; and a position of the protruding portion is defined by a position regulating member, whereby parallelism is adjustable so that a surface including the protruding portion is parallel to a surface to be irradiated with the charged particle beam after passing through the aperture.

7 Claims, 6 Drawing Sheets

ELECTROSTATIC LENS ARRAY

BACKGROUND OF THE INVENTION

1. Field of the Invention

The present invention relates to an electrostatic lens array that is used for a charged particle optical system.

2. Description of the Related Art

A multi-charged-particle beam drawing apparatus uses an electrostatic lens array for converging a charged particle beam (see Japanese Patent Application Laid-Open No. 2005-032480 and International Publication No. WO2011/043668). The multi-charged-particle beam drawing apparatus accelerates, shapes, and reduces charged particles emitted from a charged particle source, and irradiates a sample with the charged particle beam so as to draw a desired pattern on the sample. When shaping the charged particle beam, the electrostatic lens array is used for converging multiple charged particle beams separately.

In the invention described in Japanese Patent Application Laid-Open No. 2005-032480, the electrostatic lens array is a lens for an image before a reducing optical system. Therefore, an influence of a defocus amount is small, which is generated due to a thickness variation of electrodes constituting the electrostatic lens. In contrast, in the case of a multi-column type charged particle optical system including the electrostatic lens array for an objective lens that is a reducing optical system, the influence of a defocus amount which is generated due to a thickness variation of electrodes is large.

As another example using an electrostatic lens for an objective lens, in the case of an electron microscope using a single particle beam for example, even if a thickness variation of electrodes constituting the electrostatic lens occurs, the electrostatic lens that functions as an electrostatic lens at one time is a single aperture. Therefore, focus can be adjusted in the vicinity of the aperture, and there is no essential problem.

However, in the case of an apparatus which uses multiple particle beams, it is necessary that many particle beams are focused simultaneously by the electrostatic lens array having many apertures.

In addition, in the invention described in International Publication No. WO2011/043668, the electrostatic lens array used for the objective lens is fixed to a lens assembly mainly with an adhesive. Therefore, even after the adjustment of parallelism between the lens assembly and a wafer, the electrostatic lens array and the wafer are not always parallel to each other. Therefore, in the charged particle optical system using the electrostatic lens array for the objective lens, it is necessary to perform a difficult adjustment for minimizing a total focus deviation by evaluating an image formed by the multiple electrostatic lenses.

As described above, this focus adjustment takes long time in the conventional apparatus.

SUMMARY OF THE INVENTION

In view of the above-mentioned problem, it is an object of the present invention to provide an electrostatic lens array, a charged particle optical system, and a focus adjustment method, which can easily adjust focus in a whole electrostatic lens array even if electrodes constituting the electrostatic lens array have a thickness variation.

According to an exemplary embodiment of the present invention, there is provided an electrostatic lens array, including multiple substrates arranged with intervals, each of the multiple substrates having an aperture for passing a charged particle beam, in which: with respect to a travelling direction of the charged particle beam, a peripheral contour line formed by any one of surfaces of the multiple substrates other than an upper surface of a most upstream substrate and a lower surface of a most downstream substrate has a protruding portion protruding from a peripheral contour line of one of the upper surface of the most upstream substrate and the lower surface of the most downstream substrate; and a position of the protruding portion is defined by a position regulating member, whereby parallelism is adjustable so that a surface including the protruding portion is parallel to a surface to be irradiated with the charged particle beam after passing through the aperture.

Further features of the present invention will become apparent from the following description of exemplary embodiments with reference to the attached drawings.

DESCRIPTION OF THE EMBODIMENTS

In the following, an embodiment of the present invention is described.

In this embodiment, an electron beam is used as a charged particle beam, but the present invention can also be applied to an ion beam.

Figure 10:
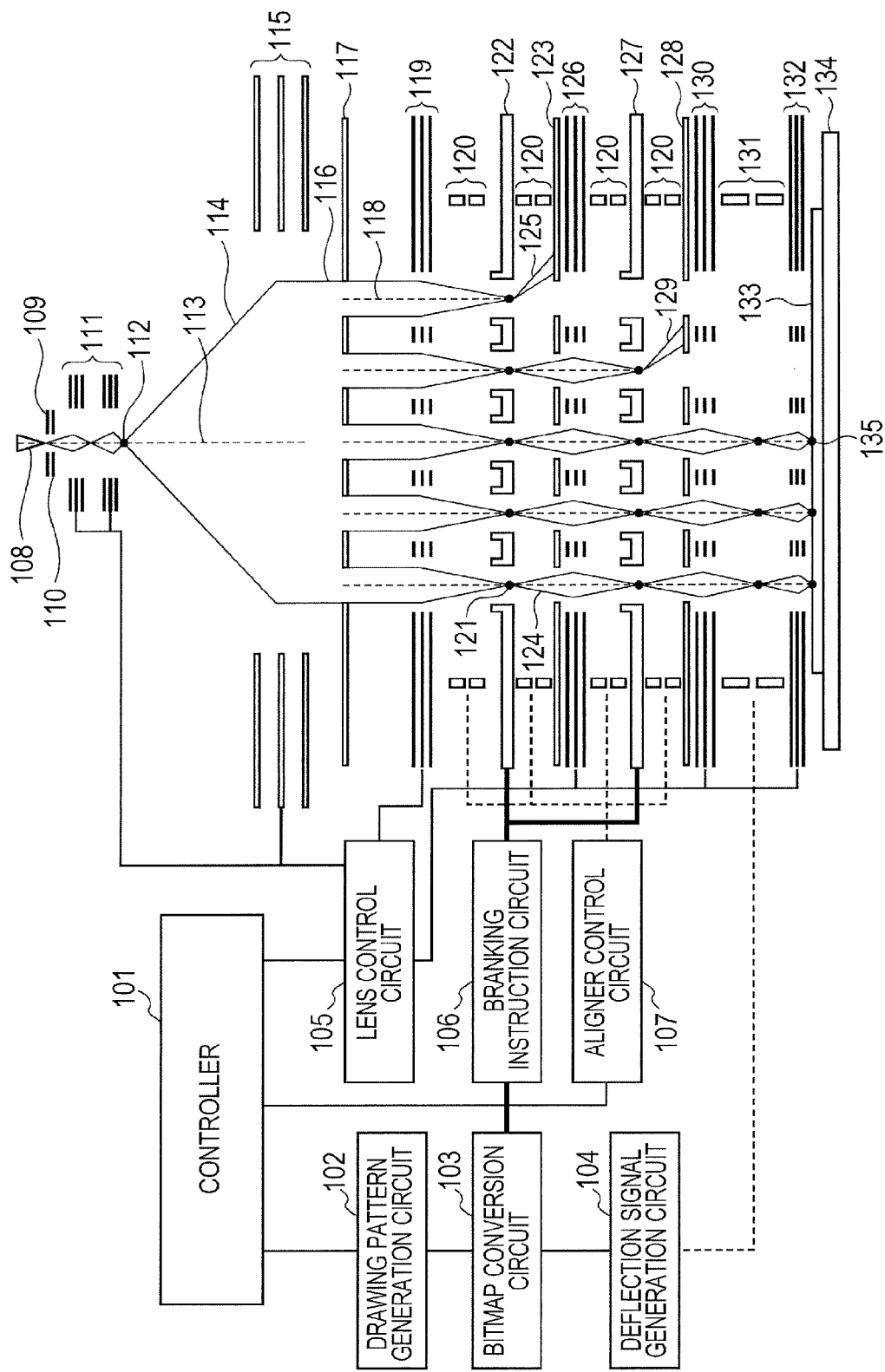
FIG. 10 is a schematic diagram illustrating a whole structure of a charged particle optical system according to the embodiment of the present invention.

FIG. 10 is a schematic diagram illustrating a whole structure of a multi-charged particle optical system according to this embodiment.

This embodiment is a so-called multi-column type having separate projecting systems.

An electron beam 114, which is emitted from an electron source (charged particle source) 108 and is extracted by an anode electrode 110, forms an irradiation optical system crossover 112 by a crossover adjustment optical system 111.

Here, as the electron source 108, a so-called thermionic type electron source of LaB6, BaO/W (dispenser cathode), or the like is used.

The crossover adjustment optical system 111 is constituted of two stages of electrostatic lenses. Each of first and second stage electrostatic lenses is constituted of three electrodes and is a so-called einzel lens in which a negative voltage is applied to an intermediate electrode, and upper and lower electrodes are connected to the ground.

The electron beam 114 emitted in a wide range from the irradiation optical system crossover 112 is collimated by a collimator lens 115 to be a collimated beam 116, which irradiates an aperture array 117.

Multiple electron beams 118 divided by the aperture array 117 are focused separately by a focus lens array 119, and positions thereof are adjusted by an aligner 120 controlled by an aligner control circuit 107. Thus, images of the multiple electron beams 118 are formed on a blanker array 122.

Here, as the focus lens array 119, an electrostatic lens array is used, which includes multiple electrode substrates (hereinafter referred to simply as substrates) arranged in the up and down directions with intervals, and each of the substrates has multiple apertures for passing the electron beam.

For instance, an einzel lens array is used, in which three multi-aperture electrodes form an electrostatic lens, only the intermediate electrode among the three electrodes is applied with a negative voltage, and the upper and lower electrodes are connected to the ground. In addition, the aperture array 117 also has a role of defining an NA (convergence semi-angle) and therefore is disposed at a pupil plane position of the focus lens array 119 (front focal plane position of the focus lens array). The blanker array 122 is a device having separate deflection electrodes and turns on and off individual beams in accordance with a drawing pattern based on a blanking signal generated by a drawing pattern generation circuit 102, a bitmap conversion circuit 103, and a blanking instruction circuit 106.

When the beam is in the on state, a voltage is not applied to the deflection electrode of the blanker array 122. When the beam is in the off state, the voltage is applied to the deflection electrode of the blanker array 122 so that the multiple electron beams are deflected.

If multiple electron beams 124 are not deflected by the blanker array 122, the multiple electron beams 124 pass through a stop aperture array 123 disposed behind the blanker array 122 so that the beams are in the on state. If multiple electron beams 125 are deflected by the blanker array 122, the multiple electron beams 125 are blocked by the stop aperture array 123 so that the beams are in the off state.

The blanker array 122 is constituted of two stages, and a second blanker array 127 and a second stop aperture array 128 having the same structures as those of the blanker array 122 and the stop aperture array 123 are disposed in a later stage. The second stop aperture array 128 blocks an electron beam 129 deflected by the second blanker array 127.

Images of the multiple electron beams after passing through the blanker array 122 are formed on the second blanker array 127 by a second focus lens array 126. Further, the multiple electron beams are focused by a third focus lens 130 and an electrostatic lens array 132 so that images thereof are formed on a wafer 133 (sample surface).

Here, the second focus lens array 126, the third focus lens array 130, and the electrostatic lens array 132 are einzel lens arrays.

A reduction ratio of the electrostatic lens array 132 is set to approximately 100. A potential of the intermediate electrode of the electrostatic lens array 132 is controlled by a lens control circuit 105.

Thus, an electron beam 121 (having a spot diameter of 2 μm in FWHM) on an intermediate image plane of the blanker array 122 is reduced to 1/100 on a surface of the wafer 133, and hence images of multiple electron beams having a diameter of approximately 20 nm in FWHM are formed on the wafer.

Scanning of the wafer by the multiple electron beams can be performed by a deflector 131. The deflector 131 is formed of counter electrodes and includes four stages of counter electrodes so as to perform two-stage deflection in x and y directions (two stages of deflectors are illustrated as one unit in the diagram for simple illustration).

The deflector 131 is driven by a signal from a deflection signal generation circuit 104.

While a pattern is being drawn, the wafer 133 is continuously moved in an X direction by a stage 134, and an electron beam 135 on the wafer surface is deflected in a Y direction by the deflector 131 based on a length measurement result by a laser measuring machine in real time.

At the same time, the beams are turned on and off separately by the blanker array 122 and the second blanker array 127 in accordance with a drawing pattern. Thus, a desired pattern can be drawn on the surface of the wafer 133 at high speed.

The individual circuits are controlled in cooperation with each other by a controller 101.

Figure 2:
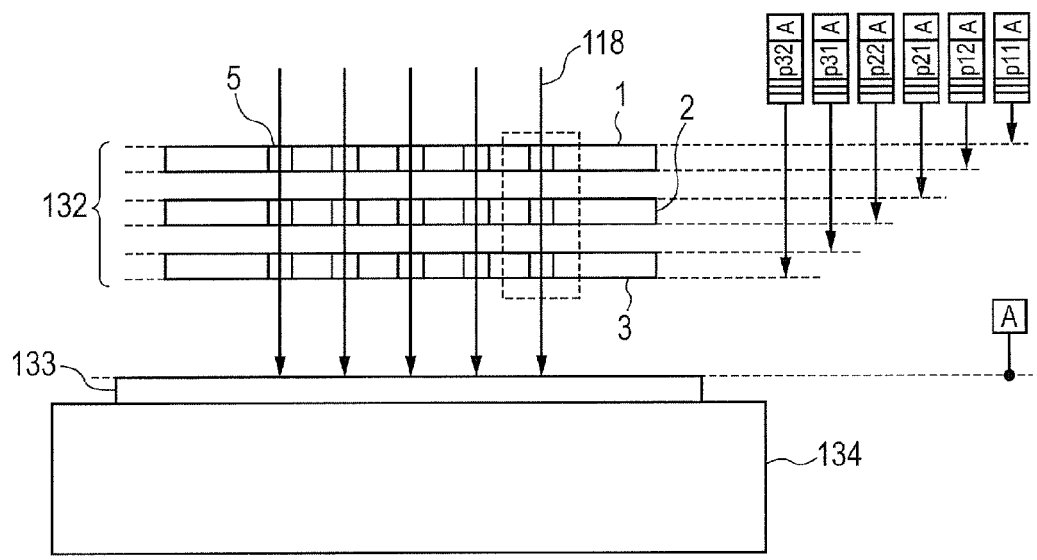
FIG. 2 is a schematic diagram illustrating an electrostatic lens array according to an embodiment of the present invention.

FIG. 2 is an enlarged view of the electrostatic lens array 132.

The electrostatic lens array 132 includes three substrates with intervals as a first electrode 1, a second electrode 2, and a third electrode 3, and apertures 5 are formed in each substrate and are aligned so as to converge the multiple electron beams 118 separately.

The multiple electron beams 118 are focused so that the multiple electron beams 118 after passing through the apertures 5 of the electrostatic lens array 132 irradiate the wafer 133 and are focused on the irradiation surface. For instance, the first electrode 1 and the third electrode 3 of the electrostatic lens array 132 are connected to the ground, and the second electrode 2 of the electrostatic lens array 132 is applied with an appropriate voltage.

In FIGS. 2, p11, p12, p21, p22, p31, and p32 respectively indicate parallelism of a first electrode upper surface as an uppermost surface, a first electrode lower surface, a second electrode upper surface, a second electrode lower surface, a third electrode upper surface, and a third electrode lower surface as a lowermost surface, with respect to the surface of the wafer 133. In this embodiment, a smallest parallelism among p12, p21, P22, and P31 is made smaller than a smaller one of the parallelism P11 and P32, and hence a position of the electrostatic lens array 132 can be adjusted. The reason of this is described below in detail.

FIGS. 3A to 3F are enlarged views of a region enclosed by a broken line rectangle in FIG. 2.

Figure 3A:
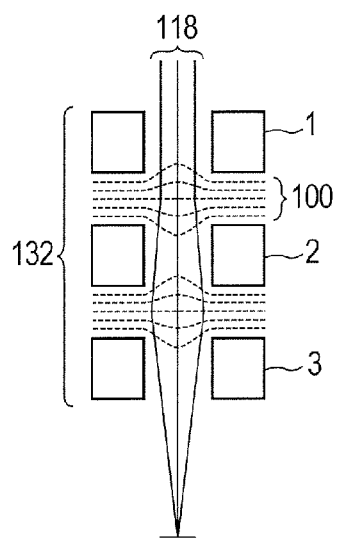
FIGS. 3A, 3B, 3C, 3D, 3E, and 3F are enlarged views illustrating a defocus state of the electrostatic lens array according to the embodiment of the present invention.

A lens function of the electrostatic lens is formed by equipotential lines 100 generated between electrodes. FIG. 3A shows the state in which the electrode 1, the electrode 2, and the electrode 3 have the same thickness, and the focal position is on the wafer 133. When the electrode has a thickness variation, the first electrode 1, the second electrode 2, and the third electrode 3 have locally different thicknesses.

Figure 3B:
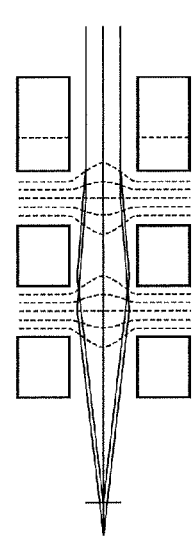
Figure 3C:
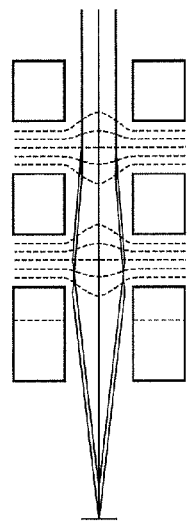

In this case, if a distance from the wafer 133 is adjusted with the first electrode upper surface or the third electrode lower surface as the reference as illustrated in FIG. 3B or 3C, a whole lens is shifted so that defocus is generated by the same amount as the electrode thickness variation.

Figure 3D:
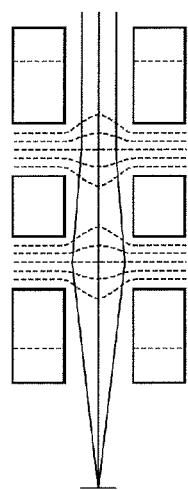

In contrast, in the case where the third electrode upper surface is the reference as illustrated in FIG. 3D for example, even if a thickness of the first electrode 1 or the third electrode 3 is varied, the variation scarcely contributes to the equipotential lines 100 as long as there is no variation in the thickness of the second electrode 2 and the electrode interval. Therefore, a focal position is scarcely affected.

Figure 3E:
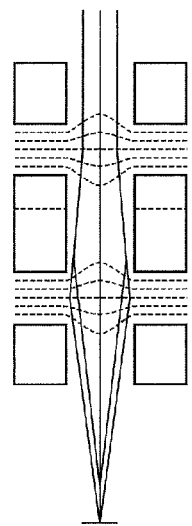
Figure 3F:
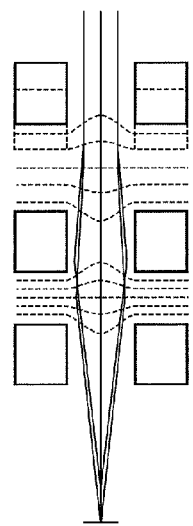

On the other hand, if the thickness of the second electrode 2 is increased as illustrated in FIG. 3E, a drift space of particles passing through the second electrode 2 is increased. Compared with the case where the first electrode upper surface or the third electrode lower surface is the reference, however, the focal position is scarcely affected. In addition, if the interval between the first electrode 1 and the second electrode 2 is changed as illustrated in FIG. 3F, the interval between the equipotential lines 100 is changed. However, a force expanding a locus of the beam and a force converging the locus of the beam are generated in the first electrode lower surface and the second electrode upper surface, respectively, and the forces act in the directions to cancel each other. Therefore, compared with the case where the first electrode upper surface or the third electrode lower surface is the reference, the influence on the focal position is also smaller.

For this reason, a position of the electrostatic lens array 132 can be easily adjusted so that a defocus amount of the whole multiple electron beams 118 is decreased, by using a surface of an electrode other than the first electrode upper surface and the third electrode lower surface as the reference for adjusting parallelism with the surface of the wafer 133.

In addition, the third electrode upper surface is closest to a plane on the wafer 133, which defines an electric field for generating a lens effect.

Figure 4:
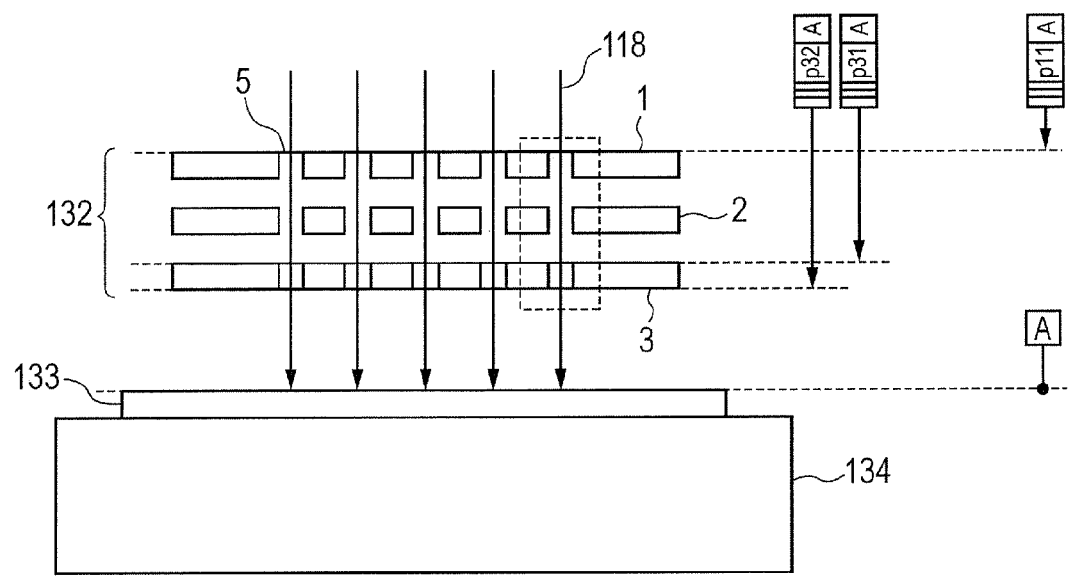
FIG. 4 is a schematic diagram illustrating positional adjustment of the electrostatic lens array according to the embodiment of the present invention.

Therefore, by making the parallelism p31 be smallest as illustrated in FIG. 4, focus can be performed more appropriately so that a position of the electrostatic lens array 132 can be easily adjusted. The reference plane for evaluating the parallelism described above may be, for example, an approximate plane of a Z coordinate measured in a grid on a whole surface of the wafer 133. In a simplified manner, the reference plane may be an approximate plane of a Z coordinate measured in three or more points on the wafer 133. Z coordinate represents the coordinate value of the Z-axis which is the light axis 113 in FIG. 10.

On the other hand, on a target surface of the focus adjustment, electrodes of the electrostatic lens 132 or a spacer as a member for defining an interval between the electrodes is provided.

The above-mentioned reference plane is prepared as the approximate plane of the Z coordinate in which three or more points on the surface are measured directly or indirectly via a member having an accurate height.

In order to measure the Z coordinates for evaluating the parallelism, it is more preferred that the electrode surface to be a target of the electrostatic lens array 132 with respect to the surface of the wafer 133 can be detected from outside of the electrostatic lens array 132.

With respect to the travelling direction of the multiple electron beams 118, a peripheral contour line of any substrate surface other than the most upstream substrate upper surface (uppermost surface) and the most downstream substrate lower surface (lowermost surface) has a protruding portion protruding from a peripheral contour line of the most upstream substrate upper surface or the most downstream substrate lower surface.

Thus, a position of the protruding portion can be easily measured without being blocked by the uppermost surface or the lowermost surface of the electrostatic lens. Therefore, based on a desired member surface, parallelism of the electrostatic lens with respect to the wafer surface can be adjusted.

Figure 1:
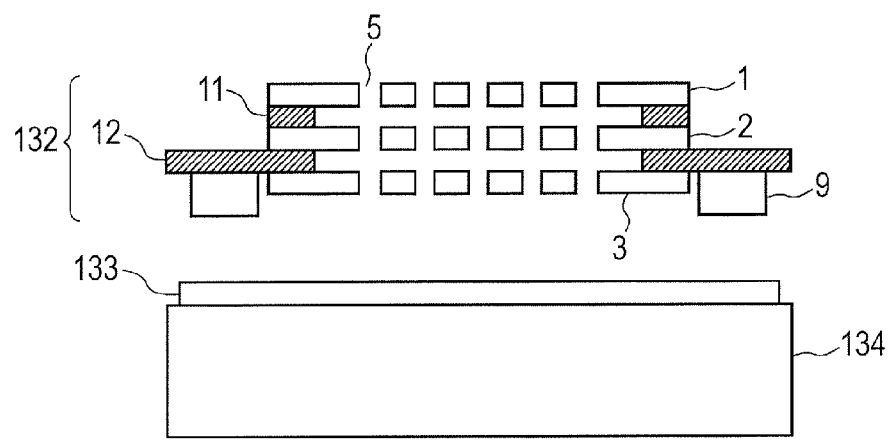
FIG. 1 is a schematic diagram illustrating an electrostatic lens array according to an example of the present invention.

For instance, as illustrated in FIG. 1, a spacer 12 is set so as to protrude from a peripheral contour line of the third electrode lower surface. Thus, a Z coordinate of the third electrode upper surface that is substantially the same surface as the lower surface of the spacer 12 can be defined by a position regulating member constituted of a capacitive sensor or a laser measuring machine.

In FIG. 1, a thin capacitive sensor 9 is disposed on the lower surface of the spacer 12, which is a preferred example because parallelism can be defined by the third electrode upper surface.

Figure 5:
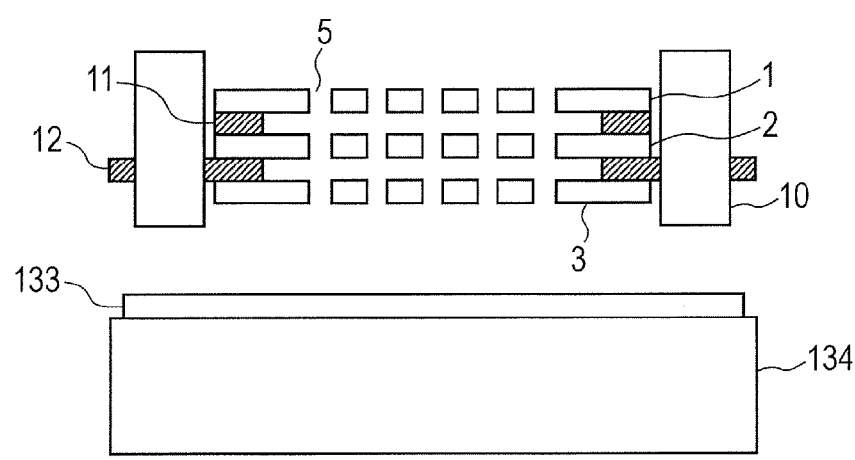
FIG. 5 is a schematic diagram illustrating an arrangement of a capacitive sensor according to the embodiment of the present invention.

It is preferred to measure a relative position between the lower surface of the spacer 12 and a lower surface of a capacitive sensor 10 in advance and to dispose the capacitive sensor 10 so as to penetrate the spacer 12 as illustrated in FIG. 5, because parallelism can be defined by the third electrode upper surface.

Figure 6:
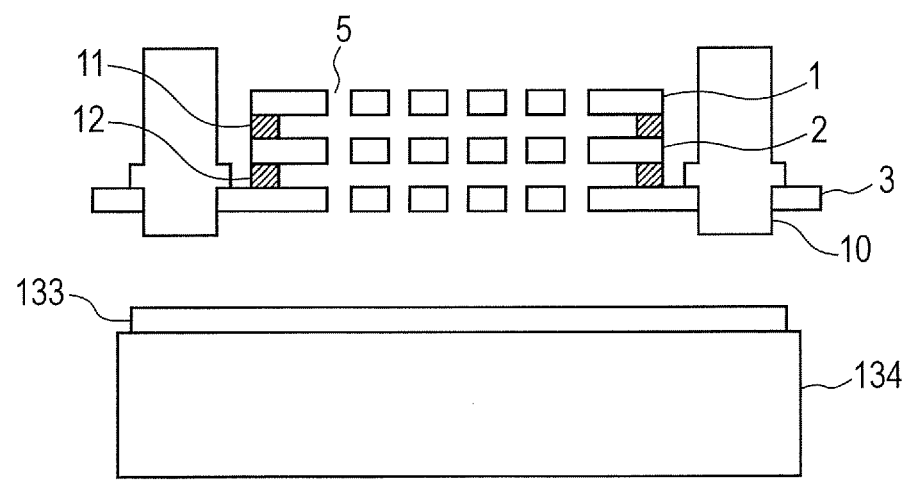
FIG. 6 is a schematic diagram illustrating another arrangement of the capacitive sensor according to the embodiment of the present invention.

In addition, it is preferred to provide the peripheral contour line of the third electrode upper surface so as to protrude from other members and to dispose the capacitive sensor 10 having a protrusion in an aperture formed in a protruding portion of the third electrode 3 so as to abut the third electrode upper surface as illustrated in FIG. 6, because parallelism of the third electrode upper surface can be defined.

Figure 7:
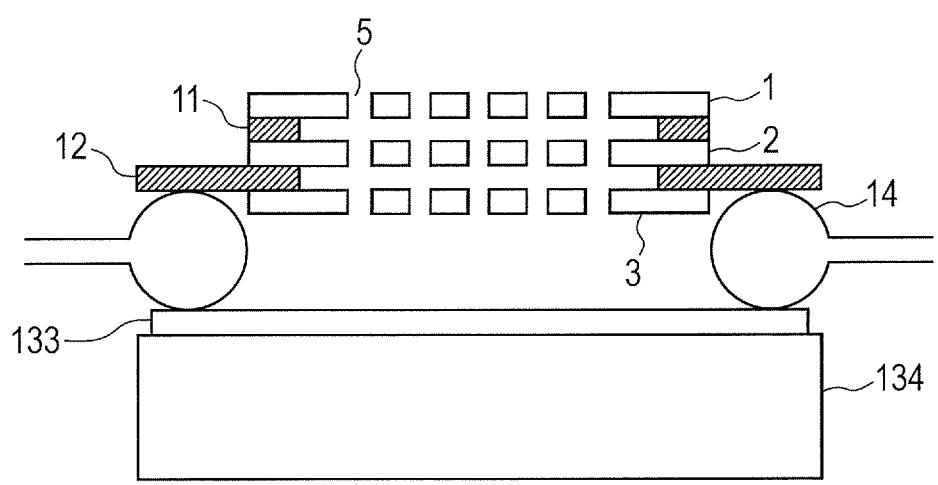
FIG. 7 is a schematic diagram illustrating adjustment of parallelism of the electrostatic lens array according to the embodiment of the present invention.

Alternatively, as another means, as illustrated in FIG. 7, it is possible to dispose the spacer 12 of the electrostatic lens array 132 so as to protrude from the third electrode 3 and to define parallelism of the electrostatic lens array 132 with respect to the protruding portion by way of the position regulating member 14 which is to be removed after regulating the position.

Figure 8A:
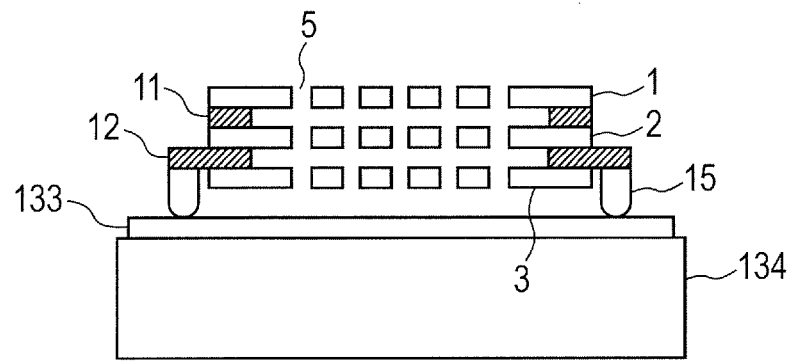
FIGS. 8A and 8B are schematic diagrams illustrating an arrangement of a position regulating member according to the embodiment of the present invention.
Figure 8B:
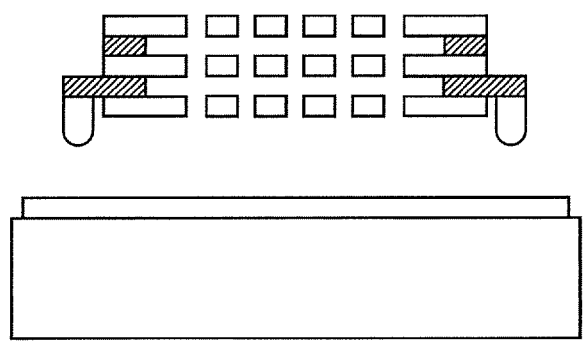

In addition, as illustrated in FIG. 8A, it is possible to attach a position regulating member 15 to the electrostatic lens. In this case, the height of the position regulating member 15 is set lower than a desired distance to a work. After parallelism is adjusted, the desired distance to a work is set while keeping the parallelism as illustrated in FIG. 8B. Thus, a total focus can be adjusted in an optimal manner.

Figure 9:
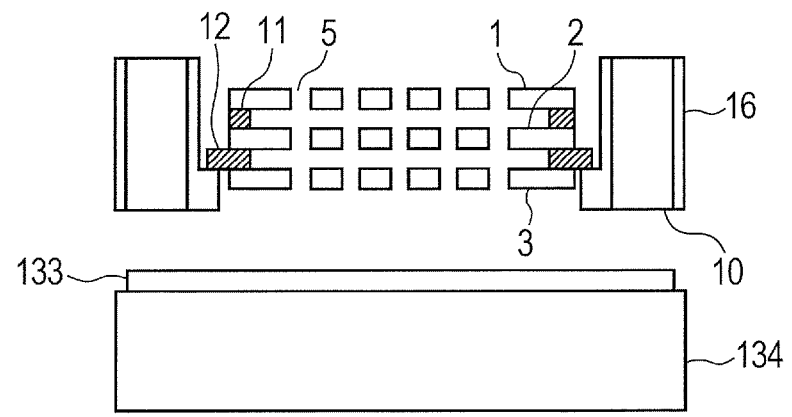
FIG. 9 is a schematic diagram illustrating another form of the capacitive sensor according to the embodiment of the present invention.

Further, as illustrated in FIG. 9, it is also said to be a preferred example in which the spacer 12 is set so as to protrude from the third electrode 3 and the capacitive sensor 10 is provided to a jig 16 for holding a protruding portion (support portion for supporting the protruding portion), because parallelism on a desired electrode surface can be defined.

In this embodiment, the above-mentioned structure of the electrostatic lens array is applied to a charged particle optical system. Thus, even if the electrodes constituting the electrostatic lens array have a thickness variation, focus can be easily adjusted in the whole electrostatic lens array.

In addition, the structure can adjust parallelism between the sample surface and any surface other than the upper surface of the uppermost electrode and the lower surface of the lowermost electrode among upper and lower surfaces of the multiple electrodes. Thus, it is possible to realize a focus adjustment method for a charged particle optical system, in which focus adjustment can be easily performed.

In the following, an example of the present invention is described.

EXAMPLE 1

As Example 1, a structure example of an electrostatic lens array to which the present invention is applied is described with reference to FIG. 1.

FIG. 1 is a diagram illustrating details of the electrostatic lens array 132 illustrated in FIG. 10. An average thickness of each of the first electrode 1, the second electrode 2, and the third electrode 3 is 100 µm, and an average interval between the electrodes is 400 µm. Each electrode is made of metal or semiconductor.

An average diameter of the apertures 5 for passing the multiple electron beams is 30 µm, and an average distance between the surface of the wafer 133 and the lower surface of the electrostatic lens 132 is 100 µm.

Further, values of the thickness of the electrode, the interval between the electrodes, and the distance between the surface of the wafer 133 and the lower surface of the electrostatic lens 132 are not accurate but have errors of approximately ±1 µm, ±0.5 µm, and ±1 µm, respectively.

In this example, the electrostatic lens array 132 has a structure in which the peripheral contour line of the lower surface of the spacer 12 has a protruding portion protruding from the peripheral contour line of the third electrode lower surface as seen from a direction substantially perpendicular to the surfaces of the multiple electrodes.

The spacer 12 has a substantially circular shape having a radius larger than a radius of the third electrode 3 having a substantially circular shape by 10 mm, and hence the spacer 12 protrudes from the third electrode lower surface over the entire periphery.

Using this electrostatic lens array 132, three thin capacitive sensors 9 as position detection units are disposed at three positions on the lower surface of the protruding portion of the spacer 12 so as to equally divide the circumference into three. Z coordinates on the whole surface of the wafer 133 are measured by the laser measuring machine and the measured data are stored as an array Z0 in advance. Then, Z coordinates from the surface of the wafer 133 measured by the thin capacitive sensors 9 disposed at the three positions of the electrostatic lens 132 are set as an array Z1.

While keeping a design distance from the surface of the wafer 133 to the third electrode upper surface, an inclination of the stage 134 is adjusted so that a sum of the squares of differences between elements of the arrays Z0 and Z1 becomes minimum.

Thus, parallelism between the third electrode upper surface and the surface of the wafer 133 is minimized with respect to other electrode surfaces.

Then, while keeping the parallelism by an adjustment mechanism (not shown) so that an average defocus amount is minimum, a distance between the third electrode upper surface and the surface of the wafer 133 is adjusted to be a predetermined distance.

With this structure, it is not necessary to form and evaluate an actual electron beam image for adjusting the inclination unlike the conventional apparatus, and hence it is possible to easily adjust focus in the whole electrostatic lens array 132.

According to the present invention, even if the electrodes constituting the electrostatic lens array have a thickness variation, it is possible to realize an electrostatic lens array, a charged particle optical system, and a focus adjustment method, which can easily adjust focus in a whole electrostatic lens array.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

1: first electrode
2: second electrode
3: third electrode
5: aperture
9: thin capacitive sensor
11: spacer between first and second electrodes
12: spacer between second and third electrodes
133: wafer
134: stage This application claims the benefit of Japanese Patent Application No. 2012-140610, filed Jun. 22, 2012, which is hereby incorporated by reference herein in its entirety.

What is claimed is:

1. An electrostatic lens array comprising:
multiple substrates spaced from each other by intervals, each of the multiple substrates having an aperture for passing therethrough a charged particle beam,
wherein with respect to a travelling direction of the charged particle beam, a peripheral contour line formed by any one of surfaces of the multiple substrates other than an upper surface of a most upstream substrate and a lower surface of a most downstream substrate has a protruding portion protruding from a peripheral contour line of both of the upper surface of the most upstream substrate and the lower surface of the most downstream substrate,
wherein a position of the protruding portion is defined by a position regulating member, whereby parallelism is adjustable so that a surface including the protruding portion is parallel to a surface to be irradiated with the charged particle beam after passing through the aperture, and
wherein the position regulating member is in contact with the protruding portion.

2. The electrostatic lens array according to claim 1, further comprising a support portion configured to support the protruding portion, wherein the parallelism is adjustable by the position regulating member via the support portion.

3. The electrostatic lens array according to claim 1, wherein the position regulating member comprises any one of a laser measuring machine, a capacitive sensor, an abutting jig, and a combination thereof.

4. The electrostatic lens array according to claim 1, wherein the multiple substrates comprise three electrodes in which a negative voltage is applied to an intermediate electrode, and other electrodes are connected to a ground.

5. A charged particle optical system comprising:
a collimator lens configured to collimate a charged particle beam emitted from a charged particle source;
an aperture array configured to divide the collimated charged particle beam; and
an electrostatic lens array configured to focus each of the divided charged particle beams so as to irradiate a sample surface,
wherein the electrostatic lens array includes multiple substrates spaced from each other by intervals, each of the multiple substrates having an aperture for passing therethrough the charged particle beam,
wherein with respect to a travelling direction of the charged particle beam, a peripheral contour line formed by any one of surfaces of the multiple substrates other than an upper surface of a most upstream substrate and a lower surface of a most downstream substrate has a protruding portion protruding from a peripheral contour line of both of the upper surface of the most upstream substrate and the lower surface of the most downstream substrate;
wherein a position of the protruding portion is defined by a position regulating member, whereby parallelism is adjustable so that a surface including the protruding portion is parallel to a surface to be irradiated with the charged particle beam after passing through the aperture, and wherein the position regulating member is in contact with the protruding portion.

6. The charged particle optical system according to claim 5, further comprising a blanker array configured to deflect each of the divided charged particle beams in accordance with a drawing pattern.

7. An electrostatic lens array comprising:

multiple substrates including at least first and second substrates; and a spacer contacting a lower surface of the first substrate and an upper surface of the second substrate to space to the first and second substrates from each other, each of the multiple substrates having an aperture for passing therethrough a charged particle beam, wherein with respect to a travelling direction of the charged particle beam, the spacer has a protruding portion protruding from a peripheral contour line of one of the upper surface of the most upstream substrate and the lower surface of the most downstream substrate, wherein a position of the protruding portion is defined by a position regulating member, whereby parallelism is adjustable so that a surface including the protruding portion is parallel to a surface to be irradiated with the charged particle beam after passing through the aperture, and wherein the position regulating member is in contact with the protruding portion.

* * * * *